US007187994B1

(12) United States Patent
Ashkenaz et al.

(10) Patent No.: US 7,187,994 B1
(45) Date of Patent: Mar. 6, 2007

(54) METHOD OF INTERFACING ANCILLARY EQUIPMENT TO FIMS PROCESSING STATIONS

(75) Inventors: Scott Ashkenaz, Palo Alto, CA (US); C. Thomas Larson, Livermore, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 918 days.

(21) Appl. No.: 09/932,580

(22) Filed: Aug. 17, 2001
(Under 37 CFR 1.47)

Related U.S. Application Data

(60) Provisional application No. 60/226,336, filed on Aug. 18, 2000.

(51) Int. Cl.
*G06F 19/00* (2006.01)

(52) U.S. Cl. .................... 700/121; 700/112; 414/217.1; 438/14

(58) Field of Classification Search ................ 700/1, 700/121, 228, 213, 108, 112, 113; 414/217, 414/217.1; 324/158.1, 765; 356/237.3, 356/237.4; 451/6; 438/14
See application file for complete search history.

(56) References Cited

U.S. PATENT DOCUMENTS

| | | | | |
|---|---|---|---|---|
| 5,940,175 A | * | 8/1999 | Sun | 356/237.3 |
| 6,020,957 A | * | 2/2000 | Rosengaus et al. | 356/237.4 |
| 6,420,864 B1 | * | 7/2002 | Abraham et al. | 324/158.1 |
| 6,591,162 B1 | * | 7/2003 | Martin | 700/228 |
| 6,625,497 B2 | * | 9/2003 | Fairbairn et al. | 700/1 |
| 6,884,639 B2 | * | 4/2005 | Dougan et al. | 438/14 |
| 2002/0118365 A1 | * | 8/2002 | Kessel et al. | 356/445 |

FOREIGN PATENT DOCUMENTS

| WO | WO 98/59229 | * 12/1998 |
|---|---|---|
| WO | WO 01/73824 | * 10/2001 |

OTHER PUBLICATIONS

"I300I Guidelines on 300 mm Process Tool Mechanical Interfaces for Wafer Lot Delivery, Buffering, and Loading," (Rev. D, Sep. 3, 1996), International 300 mm Initiative, Inc., 6 pgs.

(Continued)

*Primary Examiner*—Leo Picard
*Assistant Examiner*—Steven R. Garland
(74) *Attorney, Agent, or Firm*—Baker & McKenzie LLP

(57) ABSTRACT

This invention includes a method of integrating into a semiconductor specimen fabrication station a process diagnostic module that performs on the semiconductor specimen a processing operation that otherwise would not be performed by the processing components to thereby make the fabrication station more efficient and flexible to use. The process diagnostic module includes, for example, a specimen parameter measurement system or a specimen inspection system and is configured to mount on a front-opening interface mechanical standard (FIMS) load port and fits within the allowable spatial envelope. This invention further includes located external to the semiconductor specimen fabrication station a processor that receives and processes data acquired by the process diagnostic module during its operation.

12 Claims, 5 Drawing Sheets

OTHER PUBLICATIONS

SEMI E19-0697, "Standard Mechanical Interface (SMIF)," © SEMI 1991, 1997, pp. 1-5.

SEMI E19.1-0697, Port Standard for Mechanical Interface of Wafer Cassette Transfer, 100 mm (4 inch) Port, © SEMI 1991, 1997, pp. 1-2.

SEMI E19.5-0996, "Specification for 300 mm Bottom-Opening Standard Mechanical Interface (SMIF)," © SEMI 1978, 1996, pp. 1-4.

SEMI E21-94, "Cluster Tool Module Interface: Mechanical Interface and Wafer Transport Standard," © SEMI 1991, 1999, pp. 1-7.

SEMI E21.1-1296, "Cluster Tool Module Interface 300 mm: Mechanical Interface and Wafer Transport Standard," © SEMI 1992, 1996, pp. 1-5.

SEMI E22-0697, "Cluster Tool Module Interface: Transport Module End Effector Exclusion Volume Standard," © SEMI 1991, 1997, pp. 1-6.

SEMI E22.1-1296, "Cluster Tool Module Interface 300 mm: Transport Module End Effector Exclusion Volume Standard," © SEMI 1992, 1996, pp. 1-3.

SEMI E1.9-0699, "Provisional Mechanical Specification for Cassettes used to Transport and Store 300 mm Wafers," © SEMI 1994, 1999, pp. 1-21.

SEMI E15-0698, "Specification for Tool Load Port," © SEMI 1990, 1998, pp. 1-8.

SEMI E15.1-0200A, "Provisional Specification for 300 mm Tool Load Port," © SEMI 1996, 2000, pp. 1-11.

SEMI E15.1-0600, "Specification for 300 mm Tool Load Port," © SEMI 1996, 2000, pp. 1-11.

SEMI E47-0301, Specification for 150 mm/200 mm Pod Handles, © SEMI 1995, 2001, pp. 1-4.

SEMI E47.1-0301, "Provisional Mechanical Specification for Boxes and Pods used to Transport and Store 300 mm Wafers," © SEMI 1997, 2001, pp. 1-21.

SEMI E57-0600, "Mechanical Specification for Kinematic Couplings used to Align and Support 300 mm Wafer Carriers," © SEMI 1996, 2000, pp. 1-7.

SEMI E62-0701, "Provisional Specification for 300 mm Front-Opening Interface Mechanical Standard (FIMS)," © SEMI 1997, 2001, pp. 1-9.

SEMI E63-0600A, "Mechanical Specification for 300 mm Box Opener/Loader to Tool Standard (Bolts-M) Interface," © SEMI 1997, 2000, pp. 1-7.

SEMI E64-0600, "Specification for 300 mm Cart to SEMI E15.1 Docking Interface Port," © SEMI 1997, 2000, pp. 1-5.

* cited by examiner

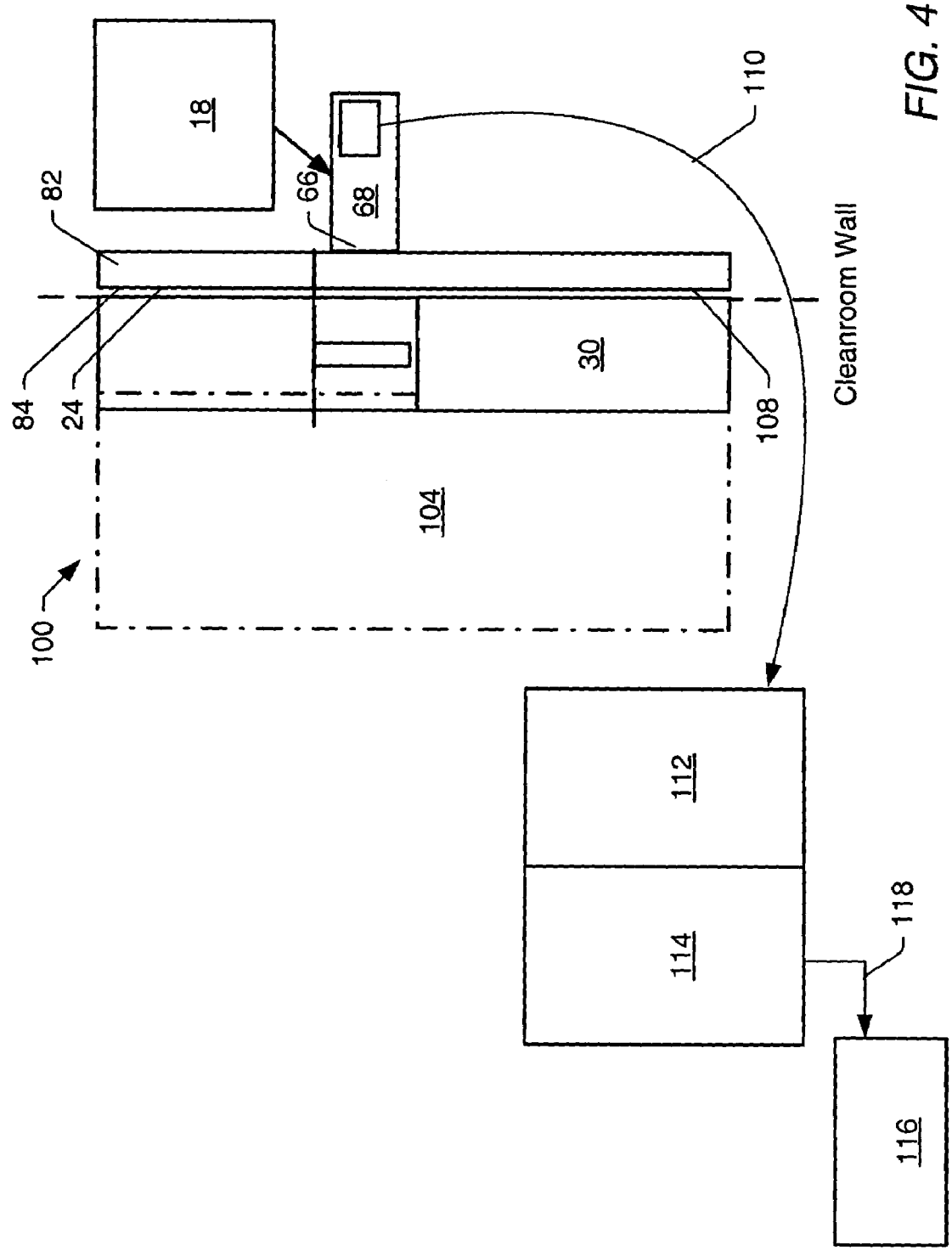

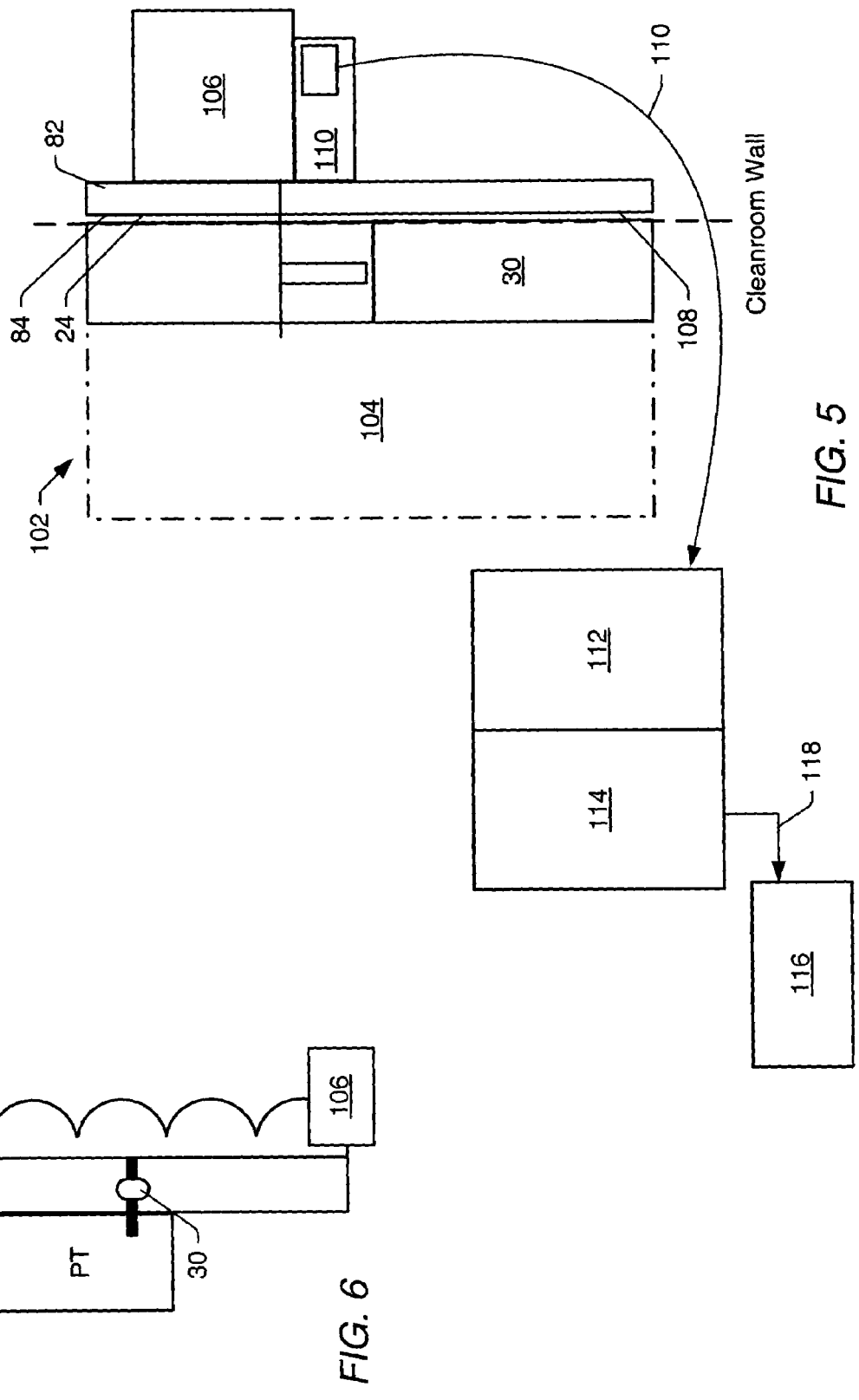
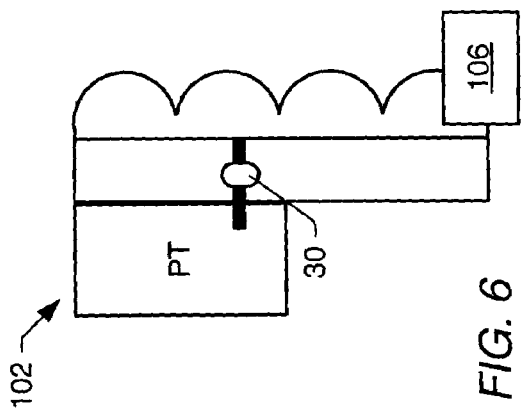
FIG. 5
FIG. 6

METHOD OF INTERFACING ANCILLARY EQUIPMENT TO FIMS PROCESSING STATIONS

PRIORITY CLAIM

This application claims priority to U.S. Provisional Application No. 60/226,336 filed Aug. 18, 2000.

TECHNICAL FIELD

This invention relates to front-opening interface mechanical standard (FIMS) semiconductor device processing stations and, in particular, to a method of interfacing ancillary equipment to FIMS stations to make better, more flexible use of them.

BACKGROUND OF THE INVENTION

The fabrication of semiconductor devices entails numerous processing operations such as parameter measurements and inspections of semiconductor wafers on which the devices are formed during various stages of their development. Current semiconductor wafer inspection and measurement systems are separate stand-alone machines to and from which an attendant often manually transports the semiconductor wafers in a clean room environment. This procedure results in logistical problems and interruptions that slow the manufacturing process.

Semiconductor wafer processing is also undertaken in a minienvironment that is compatible with front-opening interface mechanical standard (FIMS) system equipment. A system designed to incorporate FIMS permits handling of semiconductor wafers inside and outside of clean room facilities by interfacing a clean semiconductor wafer cassette transport box or pod to a clean environmental housing for semiconductor processing equipment or to other clean environments. The system concept entails mating a box door on a front-opening cassette container box to a port door on an equipment enclosure and transferring the cassette into and out of the processing equipment without exposing to outside contamination the semiconductor wafers carried by the cassette.

A standard interface is required for cassette transport boxes intended to control the transport environment of cassettes containing semiconductor wafers. The standard interface addresses the proper transport box orientation for material transfer and maintains continuity between the transport box and semiconductor processing equipment environment to control particulate matter. The FIMS specifications for 300 mm diameter semiconductor wafers are set out in the Semiconductor Equipment and Materials International (SEMI) standard SEMI E47-, E57-, E62-, and E63-0298 (1996–1998).

A FIMS station includes minimum volume, sealed front-opening boxes used for storing and transporting semiconductor wafer cassettes and canopies placed over wafer processing areas of semiconductor processing equipment so that the environments inside the boxes and canopies in cooperation with clean air sources become miniature clean spaces. The standardized cassette container box for 300 mm wafers is called a front-opening unified pod (FOUP). The boxes are made of plastic materials having registration features located relative to one another within, and of sizes characterized by, relatively wide tolerances that can affect equipment alignment precision.

The SEMI standards refer only to stand-alone FIMS stations that are separate from stand-alone measurement and inspection systems. Currently semiconductor wafers are transported back and forth between FIMS stations and the measurement and inspection systems. Information such as wafer tilt and light values must, therefore, be reset and do not transpose from one system to another. Accordingly, processing corrections cannot be easily translated from the measurement and inspection systems to the FIMS station.

Moreover, the amount of time an operator spends moving a wafer cassette transport box to and from the FIMS station results in down time in the FIMS station and the measurement and inspection system. It would, therefore, be advantageous to have an integrated system in which a FIMS station using a standardized interface is compatible with wafer measurement and inspection systems to make better, more flexible use of FIMS stations. It would also be advantageous to provide in such an integrated system a remotely located data processing system that may be shared and scaled.

SUMMARY OF THE INVENTION

This invention operates in an independent automated semiconductor specimen fabrication station that includes processing components which perform programmed fabrication processing operations on a semiconductor specimen in a protected environment and is constructed to interface with ancillary equipment coupled to the fabrication station within an allowable spatial envelope specified by industry standards. One of the processing components includes a specimen handling device such as a robot mechanism for transporting semiconductor specimens to and from processing components of the fabrication station.

Preferred ancillary equipment includes a process diagnostic tool that is integrated into an independent automated semiconductor specimen fabrication station to make it more efficient and flexible to use. The process diagnostic tool performs on the semiconductor specimen a processing operation that otherwise would not be performed by fabrication station processing components. The process diagnostic tool preferably is a module (hereafter "PDM") that performs, for example, a measurement or an inspection function. The PDM is built to fit within the allowable envelope specified by the industry guidelines and standards and to mount to any load port of a FIMS station. The PDM is matable to a FIMS station in the same sense as a FIMS-compatible wafer cassette transport box is matable to a FIMS box door at a FIMS load port interface aperture.

The function of acquiring or collecting inspection or measurement information is carried out within the PDM. The processing function required for data acquired by a PDM performing measurements or inspecting for defects on a semiconductor wafer may be performed by a computer remotely located and connected to the PDM through a docking port. A docking port provides data input and output function connections, control signal connections, system power, vacuum, exhaust, and other capabilities.

More particularly, the method of practicing this invention includes the steps of positioning the process diagnostic tool in registration within the allowable spatial envelope of the fabrication station to effect an interface in compliance with the specified industry standards, causing the specimen handling device to provide to the process diagnostic tool a specimen device previously presented to the fabrication station for processing but not undergoing a current operation performed by the processing components of the fabrication station, and coordinating control of process operations performed by the fabrication station and the process diagnostic tool so that they perform separate process operations on different semiconductor specimens presented to the fabrication station for processing.

Additional objects and advantages of this invention will be apparent from the following detailed description of a preferred embodiment thereof which proceeds with reference to the accompanying drawings.

BRIEF DESCRIPTION OF THE DRAWINGS

FIG. 4 is a pictorial diagram showing a side view of a FIMS station designed to accommodate a PDM adapted for mounting on kinematic mounts designed for a FOUP in accordance with SEMI interface standards.

FIG. 5 is a pictorial diagram showing a side elevation view of a FIMS station configured with a PDM that is custom designed to interface with the load port aperture of the FIMS station.

FIG. 6 shows a miniaturized top plan view of the FIMS station of FIG. 5 showing one aperture for a PDM and three apertures for FOUPs.

DETAILED DESCRIPTION OF A PREFERRED EMBODIMENT

This invention entails integrating a measurement or an inspection system in the form of a PDM onto or into an independent, automated manufacturing system of semiconductor wafers. The latter of such systems includes a semiconductor process tool and is preferably a FIMS station. Processes carried out by a PDM could be but are not limited to defect inspection, particle inspection, film thickness measurement, circuit pattern overlay fidelity measurement, or circuit critical dimension (CD) measurement. An example of an inspection system that can be configured in the form of a PDM is described in U.S. patent application Ser. No. 09/070,437, filed Apr. 30, 1998, for A System and Method for Inspecting Semiconductor Wafers, which issued as U.S. Pat. No. 6,020,957 to Rosengaus et al. and which is assigned to the assignee of the present patent application and is incorporated by reference herein.

The invention provides added capability to the FIMS station onto or into which a PDM is integrated by using the PDM to perform on a semiconductor wafer specimen a function that would not otherwise be carried out at the FIMS station. For example, a FIMS station processes semiconductor wafers that are delivered to it in a cassette carrying multiple wafers. The FIMS station itself may have a capacity to process only a few wafers at a time, while the remaining wafers not in process are held in a queued status. The PDM performs its operation on the wafers held in queued status while they await processing by the semiconductor process tool housed within the FIMS station. The PDM can alternatively perform its operation on wafers already processed while subsequent wafers are loaded in the FIMS station. It is possible to configure the operation of the PDM and the operations carried out by FIMS station equipment to process all wafers arriving at the FIMS station in a manner that provides little or no impact on the overall processing time of a particular manufacturing step.

Figure 1:
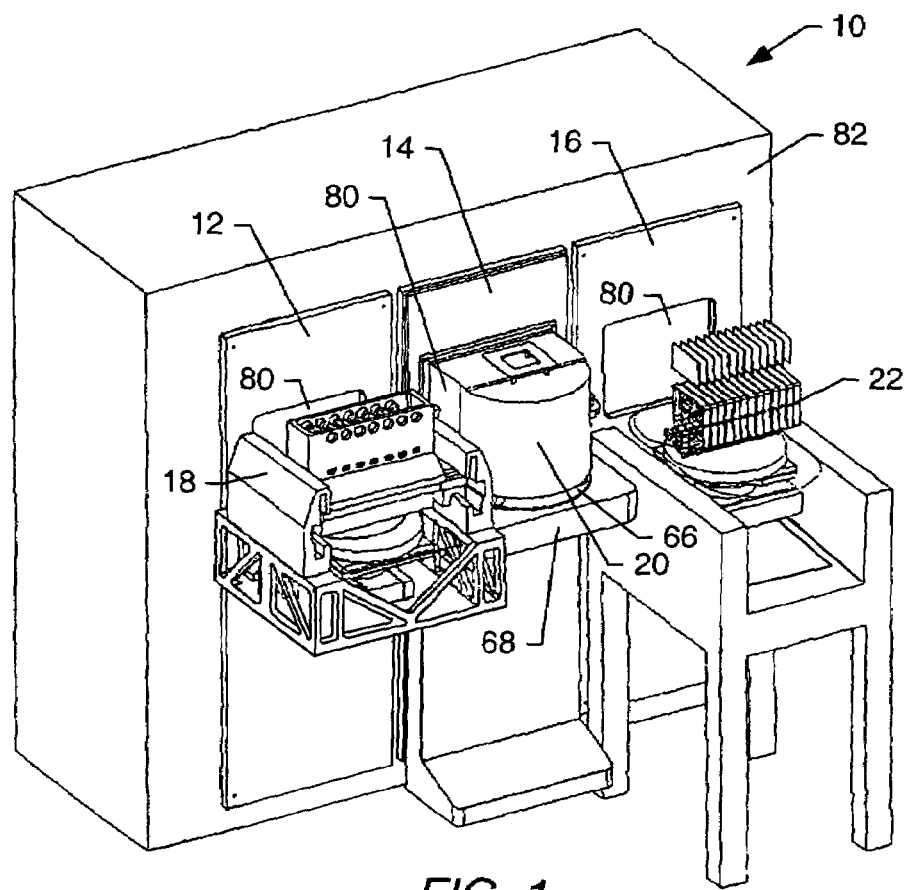
FIGS. 1 and 2 are respective frontal isometric and top plan views of a FIMS station with three load ports configured to matably interface with a FOUP or PDM in accordance with the present invention.
Figure 2:
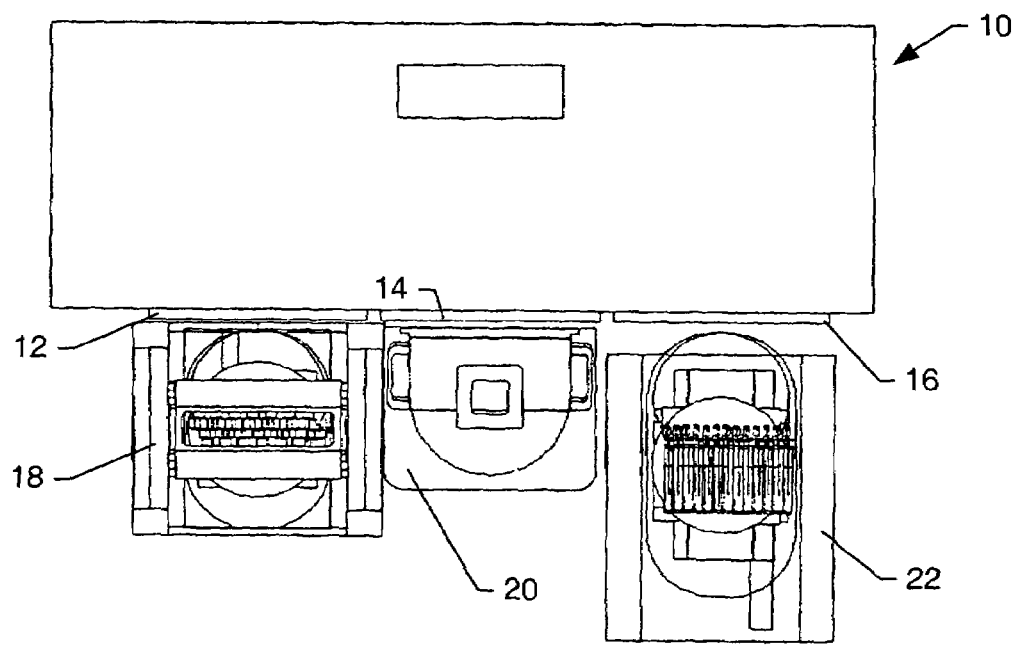
Figure 3A:
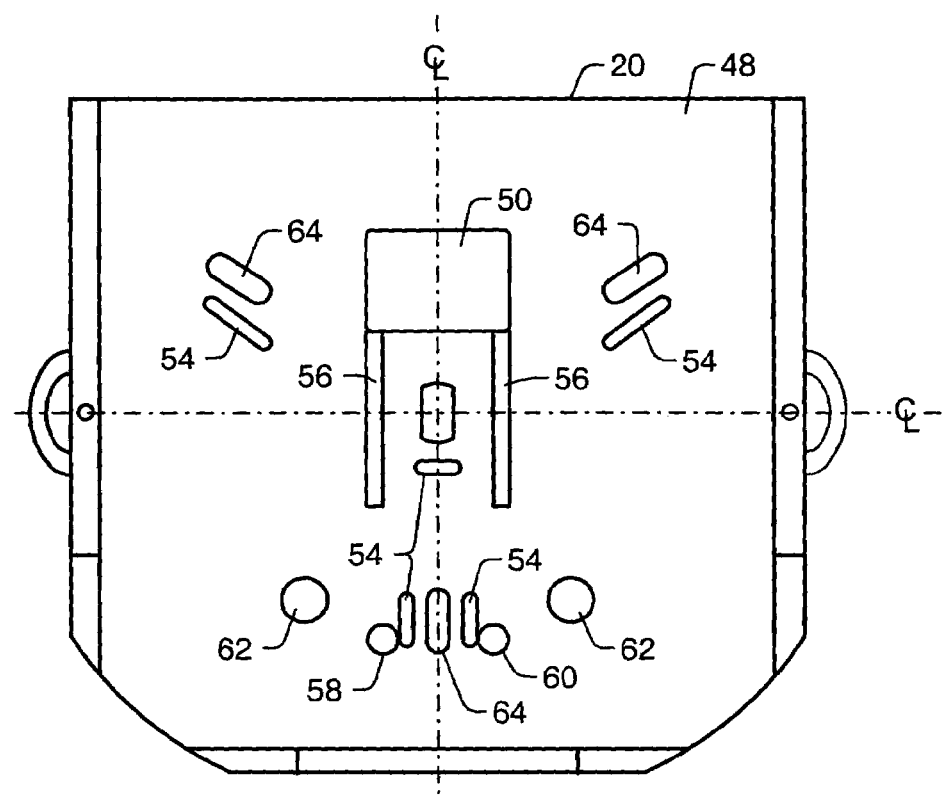
FIGS. 3A and 3B shown, respectively, a bottom surface and a box front retaining feature on the bottom surface of a FOUP configured in accordance with SEMI interface standards.
Figure 3B:
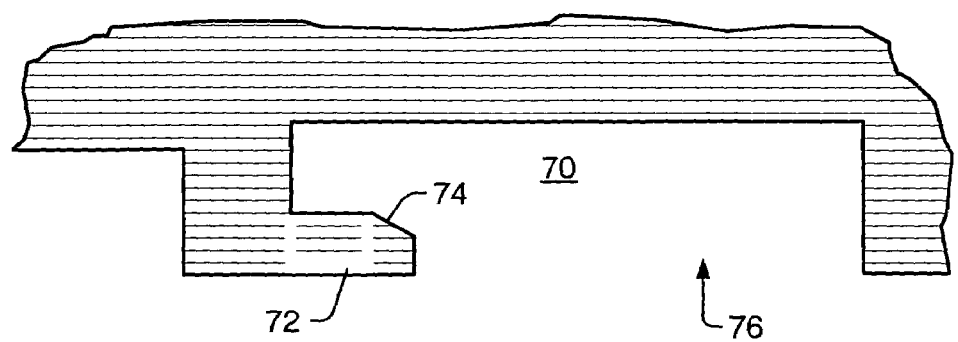

FIGS. 1 and 2 show respective frontal isometric and top plan views of a FIMS station 10 that has three load ports 12, 14, and 16 configured to matably interface with respectively a PDM 18, wafer cassette transport box 20, and a PDM 22. In the specific case of a FIMS station 10 that is designed to process 300 mm wafer material, PDMs 18 and 22 are designed to take advantage of industry standardized automation interfaces and guidelines (SEMI standards) established for the transport, loading, and processing of 300 mm wafers and their cassette transport box or FOUP. The SEMI standards include the mechanical, electrical, and software control of the transport, loading, and processing of the 300 mm wafers and their FOUPs. When FOUP 20 is delivered to port 14 of FIMS station 10, according to SEMI standards, load port 14 has a standard receptacle for accepting FOUP 20. The SEMI standards specify that FOUP 20 interface to load port 16 through a kinematic mount. The kinematic mount locates FOUP 20 in such a way as to provide reliable registration of FOUP 20 to load port 14. A load port door mechanism 24 (FIGS. 4, 5, and 7) opens FOUP 20 so that a robot mechanism 30 (FIGS. 4–7) can have access to wafers stored inside FOUP 20 and can transport them to the frontal opening of either PDM 18 or PDM 22. Thus, PDM 18 or PDM 22 may be used instead of a FOUP to perform an arbitrary process in the protected environment of the FIMS station. The SEMI standards specify the general envelope of operation of a FOUP, load port door mechanisms, and interfaces FIGS. 3A and 3B show, respectively, a bottom surface 48 and a box front retaining feature 50 on bottom surface 48 of a FOUP 20 configured in accordance with SEMI standards. A preferred FOUP 20 is a model F300 wafer carrier manufactured by Fluoroware, Inc., Chaska, Minn. With reference to FIG. 3A, FOUP 20 has on its bottom surface 48 five carrier sensing pads 54, two advancing box sensing pads 56, a carrier capacity (number of wafers) sensing pad 58, a box or cassette information pad 60, and one each of front end of line (FOEL) and back end of line (BOEL) information pads 62 required under SEMI E47.1 (Mar. 5, 1998). Three oblong, inwardly sloped depressions in bottom surface 48 form kinematic pin receiving features 64 that mate with kinematic coupling pins (not shown) fixed in corresponding locations on a translatable shelf portion 66 (FIG. 4) of load port 16 when FOUP 20 is properly installed. When FOUP 20 is placed in proper alignment on load port 16, sensing pads 54 and 58 and information pads 60 and 62 contact switches mounted in corresponding positions on translatable shelf 66 of load port 16 and advancing box sensing pads 56 contact switches mounted in corresponding positions on a stationary shelf portion 68 (FIG. 4) of load port 16.

A depression 70 partly covered by a projection 72 having a beveled surface 74 forms a front retaining or clamping feature 76. Beveled surface 74 provides a ramp along which a roller can roll up or a clamping device can slide while translatable shelf 66 of load port 16 urges FOUP 20 toward an aperture 80 in a front plate 82 of FIMS station 10 to mate with port door 24 (FIGS. 3–5) secured to an interior surface 84 of front plate 82.

Skilled persons will appreciate that practicing the invention may entail provision of an entirely new front end to a FIMS station, instead of providing compatible kinematic mounts at load port 12 or 16. FIGS. 1 and 2 show FIMS station 10 with one FOUP 20 and two apertures 80 adapted to receive PDMs 18 and 22, each of which can use robot mechanism 30 positioned within FIMS station 10 to receive wafers for other processing (e.g., defect checks and pre-alignment) while a wafer is waiting to be retrieved for processing. Thus, each of PDMs 18 and 22 effectively either replaces a wafer carrier and has functionality other than that of a load port or loads onto a standard load port and has functionality other than that of a wafer carrier. PDMs 18 and 22 are equipped with devices that connect the PDMs to a central computer and control their electrical power remotely.

FIG. 4 is a pictorial diagram showing a side elevation view of a FIMS station 100 designed to accommodate a PDM adapted for mounting on kinematic mounts designed for a FOUP in accordance with SEMI interface standards, and FIG. 5 is a pictorial diagram showing a side elevation view of a FIMS station 102 configured with a PDM that is custom designed to interface with the load port aperture of the FIMS station. FIG. 6 shows a miniaturized top plan view of the FIMS station of FIG. 5 showing one aperture for a PDM and three apertures for FOUPs.

With reference to FIGS. 4 and 5, each of FIMS stations 100 and 102 includes an arbitrary process tool 104 and a robot mechanism 30 housed in a clean room to perform their tasks in a protected environment. FIMS station 100 is designed to process 300 mm wafers and is implemented with industry standardized automated interfaces and guidelines for the transport, loading, and processing of 300 mm wafers and their cassettes. FIMS station 100 provides a modular, plug-in configuration for interfacing PDM 18 into load port 12. FIMS station 100 has a standard receptacle that includes translatable shelf 66 adapted to receive PDM 18 having a bottom surface corresponding to bottom surface 48 of FOUP 20 to fit on the kinematic mounting described above. FIMS station 102 is equipped with a PDM 106 specially configured to mate with load port 12.

For either of the embodiments of FIGS. 4 and 5, load port 12 includes in front plate 82 an aperture 80 that is sized to receive movable port door 24 secured to interior surface 84 of front plate 82. Port door 24 is movable to close aperture 80, and thereby maintain the protected environment of the clean room when no PDM is present or in sealing engagement against an exterior surface 108 of front plate 82, and to open aperture 80 to provide robot mechanism 30 with access to the PDM to enable performance of its intended processing functions. The design of FIMS station 100 and 102 to SEMI guidelines and standards that specify the general envelope of operation of the FOUP, load port mechanisms, and interfaces ensure that the permissible size and shape of a PDM of compatible design are such that it fits and operates within the allowable envelope and is mountable to any load port.

The following are several advantages of a PDM of FIMS station-compatible design. This invention facilitates, for example, for either of the embodiments of FIGS. 4 and 5, remote processing and control so that an inspection or measurement PDM performs its operation on wafers held in queued status while they wait to be or after they have been processed by the processing tool. The methodology of this invention provides added capability to a process tool with which the PDM is integrated by performing its function on manufactured material that is otherwise not productive. Scalability is also enhanced, where measurement systems own dedicated independent or shared measurement processing capability. Moreover, more than one PDM may be provided allowing for multiple inspections.

With stand alone units, in-process wafers are often times delivered from different parts of the factory to a stand-alone unit. With this invention, inspection takes place directly after processing; therefore, more acute correction is possible because the software can be adapted to become familiar with the failure cycle. There is more efficient and effective determination of when failures may occur and an opportunity to make corrections in real-time.

The invention makes possible multiple, in-process inspections, which are preferable to ensure wafers do not have loose particles before the wafers enter a processing tool. Intermediate inspection of, for example, resist coating on a wafer can preempt the fabrication process and thereby save wasted time resulting from needless use of a stepper when the resist coating is defective. Inspection after a resist coating developing process can also be performed. During CVD it is preferable to inspect between in-process wafer layer deposition stages while maintaining vacuum pressure.

Figure 7:
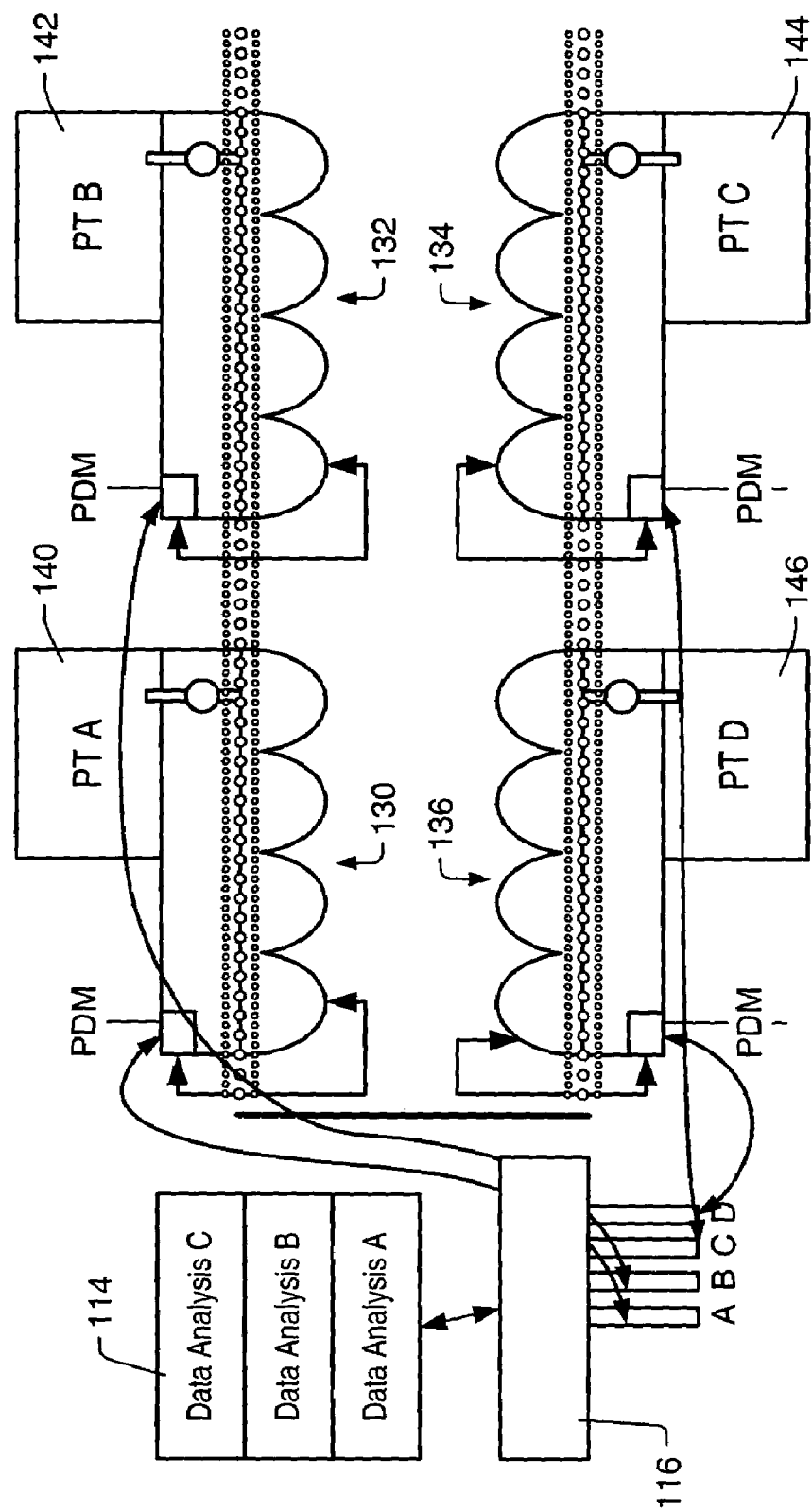
FIG. 7 shows a group of four independently operating FIMS stations and their associated PDMs configured in accordance with the invention in separate data and control communication with a remotely located central data processing image computer.

In the embodiments of both FIGS. 4 and 5, a communication interface 110 provides data and control communication with a module manager and image processing computer 112, which communicates with an analysis and station control system 114. Data and image processing takes place outside of a PDM to avoid added bulk. The in-process semiconductor wafers are identified, for example, by a readable electronic tag. A remote central computational computer 116 is linked to "dumb" sensors by a data link 118. Remote processing allows parallel or serial processing of more than one FIMS station, as shown in FIG. 7 illustrating multiple FIMS stations 130, 132, 134, and 136 and their respective processing tools 140, 142, 144, and 146. Central computer 116 may control image, data analysis, power source, the vacuum, exhaust systems, control signals, and input and output data. High speed computing power is preferable because of image processing requirements. Inspection image information is provided to either an operator or to central computer 116 to automatically adjust processing parameters according to inspection results. Providing loop control process would be beneficial, especially where there are prealignment and leveling requirements, for real-time processing correction capability.

It will be obvious to those having skill in the art that many changes may be made to the details of the above-described embodiment of this invention without departing from the underlying principles thereof. The scope of the present invention should, therefore, be determined only by the following claims.

The invention claimed is:

1. In an independent automated semiconductor specimen fabrication station that includes processing components which perform programmed fabrication processing operations on a semiconductor specimen in a protected environment and is constructed to interface with ancillary equipment coupled to the fabrication station within an allowable spatial envelope specified by industry standards, one of the processing components including a specimen handling device for transporting semiconductor specimens to and from processing components of the fabrication station, a method of integrating onto the fabrication station a process diagnostic tool to allow it to perform on the semiconductor specimen a processing operation that otherwise would not be performed by the processing components to thereby make the fabrication station more efficient and flexible to use, comprising:

positioning the process diagnostic tool in registration within the allowable spatial envelope of the fabrication station to effect an interface in compliance with the specified industry standards;

causing the specimen handling device to provide to the process diagnostic tool a specimen device previously presented to the fabrication station for processing but not undergoing a current operation performed by the processing components of the fabrication station; and coordinating control of process operations performed by the fabrication station and the process diagnostic tool so that they perform separate process operations on different semiconductor specimens previously presented to the fabrication station for processing.

2. The method of claim 1, in which the process diagnostic tool includes a specimen parameter measurement system or a specimen inspection system.

3. The method of claim 1, in which the industry standard specifying the allowable spatial envelope is a front-opening interface mechanical standard (FIMS) and in which the fabrication station includes a FIMS load port having kinematic mounts arranged to receive a front-opening unified pod (FOUP).

4. The method of claim 3, in which the process diagnostic tool is configured to mount on the FIMS load port and fits within the allowable spatial envelope.

5. The method of claim 1, in which the specimen handling device is mounted for translational movement to deliver the specimen to or remove the specimen from the process diagnostic tool in a manner that does not interrupt in-progress operation of the processing components of the fabrication station.

6. The method of claim 1, in which a processor located external to the fabrication station receives and processes data acquired by the process diagnostic tool during its operation.

7. An apparatus for manufacturing a semiconductor device, comprising:
   a) a semiconductor fabrication tool, for processing semiconductor wafers; and,
   b) a pod, interfaced to said tool at a load port, wherein said pod includes a mechanism for inspecting or measuring said wafers;
   c) wherein the apparatus is configured to cause a specimen handling device to provide to the mechanism a wafer previously presented to the tool for processing but not undergoing a current operation performed by processing components of the tool; and
   d) wherein the apparatus is further configured to coordinate control of processing operations performed by the tool and the mechanism so that they perform separate process operations on different wafers previously presented to the tool for processing.

8. A method of making a semiconductor device, comprising:
   a) inspecting a semiconductor wafer in a pod, wherein said pod is coupled to a load port of a semiconductor fabrication tool;
   b) processing said wafer in said tool;
   c) causing a specimen handling device to provide to the pod a wafer previously presented to the tool for processing but not undergoing a current operation performed by processing components of the tool; and
   d) coordinating control of process operations performed by the tool and the pod so that they perform separate process operations on different wafers previously presented to the tool for processing.

9. The method of claim 8, wherein said pod is compatible with a FOUP.

10. The method of claim 8, wherein said pod is further coupled to said process tool through a kinematic mount.

11. A computer-controlled system for collecting and processing semiconductor inspection data, comprising:
   a) at least one pod interfaced to a load port of a semiconductor fabrication tool, wherein said pod includes an apparatus for inspecting a semiconductor wafer;
   b) a memory for storing data derived from inspecting said wafer;
   c) a processor, coupled to said memory, for processing said data; and
   d) a connection to said pod, said processor and said memory for transferring said data from said pod;
   e) wherein the system is configured to cause a specimen handling device to provide to the apparatus a wafer previously presented to the tool for processing but not undergoing a current operation performed by processing components of the tool; and
   f) wherein the system is further configured to coordinate control of process operations performed by the tool and the apparatus so that they perform separate process operations on different wafers previously presented to the tool for processing.

12. A method of monitoring the functionality of a plurality of semiconductor process tools, comprising:
   a) connecting a pod to a load port of a first one of said process tools, said pod being configured to inspect semiconductor wafers;
   b) using said pod, inspecting wafers processed by said tool;
   c) disconnecting said pod from said first tool, and connecting said pod to a load port of a different one of said tools;
   d) connecting a second pod to the load port of said first tool, wherein said second pod is not configured to inspect semiconductor wafers;
   e) causing a specimen handling device to provide to the pod a wafer previously presented to the first one or the different one of said process tools for processing but not undergoing a current operation performed by processing components of the first one or the different one of said process tools; and
   f) coordinating control of process operations performed by the first one or the different one of said process tools and the pod so that they perform separate process operations on different wafers previously presented to the first one or the different one of said process tools for processing.

* * * * *